United States Patent
Ma et al.

(10) Patent No.: US 9,041,889 B2
(45) Date of Patent: May 26, 2015

(54) ARRAY SUBSTRATE AND LIQUID CRYSTAL DISPLAY PANEL

(75) Inventors: Xinli Ma, Beijing (CN); Yan Li, Beijing (CN); Qiangtao Wang, Beijing (CN); Wenbing Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 75 days.

(21) Appl. No.: 13/700,938

(22) PCT Filed: Jul. 30, 2012

(86) PCT No.: PCT/CN2012/079373
§ 371 (c)(1),
(2), (4) Date: Nov. 29, 2012

(87) PCT Pub. No.: WO2013/017066
PCT Pub. Date: Feb. 7, 2013

(65) Prior Publication Data
US 2013/0162936 A1    Jun. 27, 2013

(51) Int. Cl.
*H01L 33/08* (2010.01)
*G02F 1/1343* (2006.01)

(52) U.S. Cl.
CPC .......... *H01L 33/08* (2013.01); *G02F 1/134309* (2013.01); *G02F 1/134363* (2013.01); *G02F 2001/134318* (2013.01)

(58) Field of Classification Search
CPC ............ G02F 1/134363; G02F 1/1368; G02F 1/136227; G02F 1/136286; G02F 1/134309; G02F 1/133707; G02F 1/133345; G02F 1/1343; G02F 1/134336; G02F 2001/134372; G02F 2001/134318; G02F 1/1333; H01L 51/5203; H01L 51/5237; G09G 3/3648; G09G 2300/0426; G09G 2300/0434; G09G 2300/0447

USPC .............. 349/43, 138, 106, 42, 139, 143, 141
See application file for complete search history.

(56) References Cited

U.S. PATENT DOCUMENTS

| | | | | |
|---|---|---|---|---|
| 6,396,556 | B1 * | 5/2002 | Watanabe | 349/141 |
| 6,469,765 | B1 * | 10/2002 | Matsuyama et al. | 349/143 |
| 7,248,324 | B2 * | 7/2007 | Ono et al. | 349/141 |
| 7,522,244 | B2 * | 4/2009 | Lee | 349/141 |
| 2004/0084678 | A1 | 5/2004 | Peng et al. | |

FOREIGN PATENT DOCUMENTS

| CN | 1743933 A | 3/2006 |
|---|---|---|
| CN | 10133317 A | 1/2009 |
| CN | 101598877 A | 12/2009 |
| CN | 202159215 U | 3/2012 |

OTHER PUBLICATIONS

International Search Report: dated Aug. 1, 2011; PCT/CN2012/079373.
International Preliminary Report on Patentability dated Feb. 4, 2014; PCT/CN2012/079373.

* cited by examiner

*Primary Examiner* — Thoi Duong
(74) *Attorney, Agent, or Firm* — LADAS & PARRY LLP

(57) ABSTRACT

The disclosed technology discloses an array substrate and a liquid crystal display panel. The array substrate comprises: a base substrate; a gate line and a data line formed on the base substrate, the gate line and the data line defining a plurality of pixel regions; and a first electrode layer and a second electrode layer formed in each pixel region; and an insulating layer provided between the first electrode layer and the second electrode layer. The first electrode layer, the insulating layer and the second electrode layer are laminated on the base substrate in this order. The first electrode layer is provided with a plurality of first apertures therein, and the first electrode layer comprises a plurality of first electrode portions located between the plurality of first apertures.

12 Claims, 3 Drawing Sheets

ARRAY SUBSTRATE AND LIQUID CRYSTAL DISPLAY PANEL

FIELD OF THE INVENTION

The disclosed technology relates to an array substrate and a liquid crystal display panel.

BACKGROUND OF THE INVENTION

An Advanced-Super Dimensional Switching (AD-SDS) technology, by forming a multi-dimensional electric field with a transversal electric field generated from edges of common electrodes or pixel electrodes in the same plane and a longitudinal electric field generated between the pixel electrodes and the common electrodes, enables liquid crystal molecules in all orientations between the pixel electrodes or common electrodes as well as right above the pixel electrodes or common electrodes within a liquid crystal cell to produce rotation switching, and thus improves work efficiency of an in-plane alignment liquid crystal and increases light transmission efficiency. The Advanced-Super Dimensional Switching technology can improve display quality of a TFT-LCD, and has advantages of high transmittance, wide viewing angle, high aperture ratio, low chromatic aberration, short response time, and being free of push Mura, etc.

An AD-SDS type array substrate is an important component of the above-described liquid crystal display panel. FIG. 1 is a schematic structural view of an AD-SDS type array substrate in the prior art, and FIG. 2 is a sectional view taken along the A-A direction in FIG. 1. As shown in FIG. 1 and FIG. 2, the AD-SDS type array substrate comprises: a base substrate 11, as well as a gate line 12 and a data line 13 located on the base substrate 11. A first electrode 14, a second electrode 15 and a thin film transistor 16 are formed in a pixel region defined by the gate line 12 and the data line 13. The first electrode 14 is located on the base substrate 11, and there is formed with a gate insulating layer 17 and a passivation layer 18 on the first electrode 14. The second electrode 15 is located on the passivation layer 18 above the first electrode 14, and the second electrode 15 is a planar structure provided with apertures 19 which have a strip shape. The first electrode 14 is a planar structure without aperture. When the first electrode 14 is a common electrode, the second electrode 15 is a pixel electrode; when the first electrode 14 is a pixel electrode, the second electrode 15 is a common electrode.

In the prior art, because the first electrode in an AD-SDS type array substrate is a planar structure without apertures, the overlapping area between the second electrode and the first electrode is rather large, which leads to an increase in the storage capacitance of the AD-SDS type array substrate, thereby increasing charging and discharging time of the liquid crystal display panel.

SUMMARY OF THE INVENTION

An embodiment of the disclosed technology provides an array substrate, which comprises: a base substrate; a gate line and a data line formed on the base substrate, the gate line and the data line defining a plurality of pixel regions; a first electrode layer and a second electrode layer formed in each pixel region; and an insulating layer provided between the first electrode layer and the second electrode layer, wherein the first electrode layer, the insulating layer and the second electrode layer are laminated on the base substrate in this order, and wherein the first electrode layer is provided with a plurality of first apertures therein, and the first electrode layer comprises a plurality of first electrode portions located between the plurality of first apertures.

Another embodiment of the disclosed technology further provides a liquid crystal display panel, which comprises: a color filter substrate and an array substrate facing each other and bonding together, and a liquid crystal layer filled between the color filter substrate and the array substrate, wherein the array substrate may be any array substrate in accordance with the embodiments of the disclosed technology.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION OF THE PREFERRED EMBODIMENTS

In order to make objects, technical details and advantages of the embodiments of the invention apparent, the technical solution of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Figure 3:
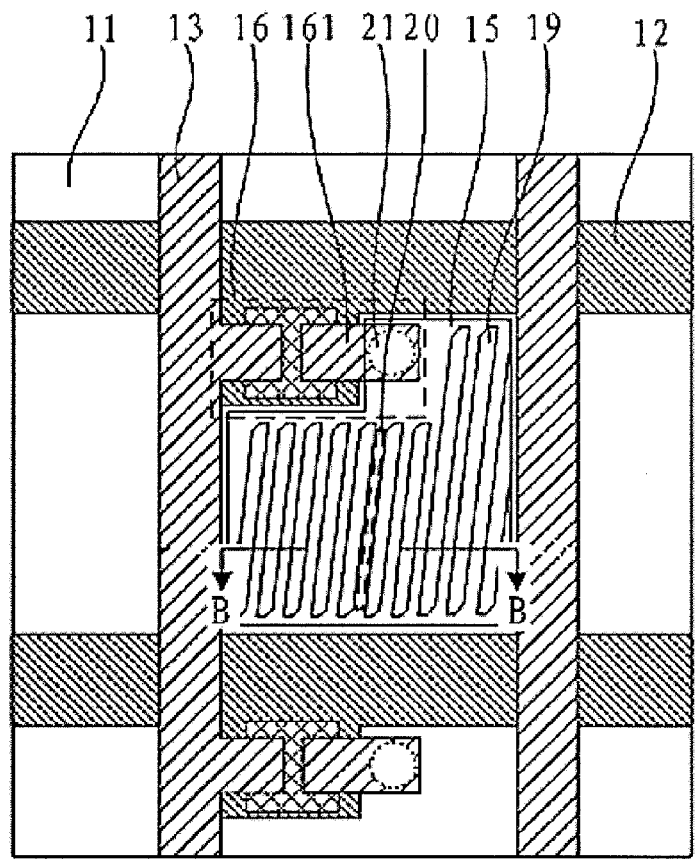
FIG. 3 is a schematic structural view of an array substrate provided by a first embodiment of the disclosed technology.
Figure 4:
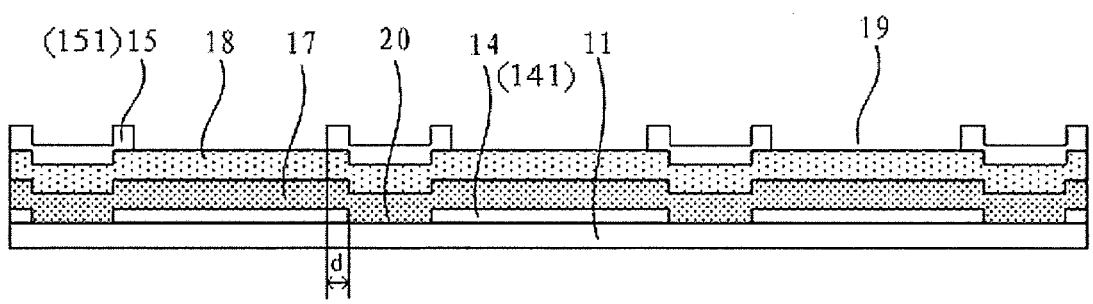
FIG. 4 is a sectional view taken along the B-B direction in FIG. 3.

FIG. 3 is a schematic structural view of an array substrate provided by a first embodiment of the disclosed technical solution, and FIG. 4 is a sectional view taken along the B-B direction in FIG. 3. As shown in FIG. 3 and FIG. 4, the array substrate comprises: a base substrate 11, as well as a gate line 12 and a data line 13 formed on the base substrate 11. The gate line 12 and the data line 13 cross with each other, and in a pixel region defined by the gate line 12 and the data line 13, there is formed with a first electrode layer 14, a thin film transistor 16, and a second electrode layer 15 which forms a multi-dimensional electric field with the first electrode layer 14. The first electrode layer 14 has a plurality of first apertures 20 therein, and comprises a plurality of first electrode portions 141 between the plurality of first apertures 20. The second electrode layer 15 has a plurality of second apertures 19 therein, and comprises a plurality of second electrode portions 151 between the plurality of second apertures 19.

In this embodiment, the first electrode layer 14 and the second electrode layer 15, for example, may be formed of a transparent conductive material.

In this embodiment, for example, each first aperture 20 is located under the second electrode portions 151. Each first aperture 20 is provided corresponding to one second electrode portions 151, and each second aperture 19 is provided corresponding to each first electrode portion 141. The width of the first apertures 20 is less than the width of the second electrode portions 151. Likewise, the width of the second apertures 19 is less than the width of the first electrode portions 141 as well.

In this embodiment, in a plane view (i.e. a view parallel to the main surface of the base substrate), each first electrode portion 141 is partially overlapped with adjacent second electrode portions 151. The width "d" of the portion that the second electrode portion 151 overlaps with the first electrode 141, for example, may be 0.2 microns to 2.0 microns.

Figure 1:
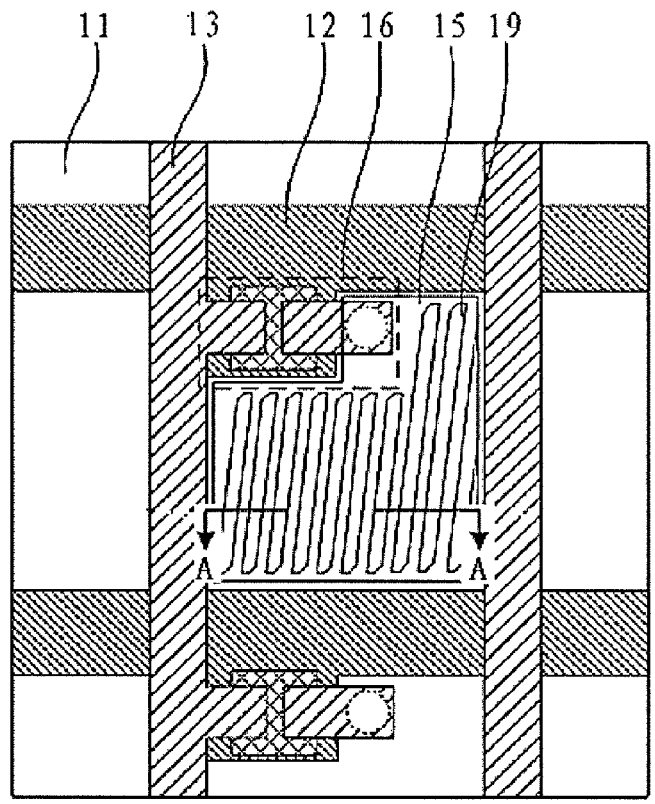
FIG. 1 is a schematic structural view of an AD-SDS type array substrate in the prior art.
Figure 2:
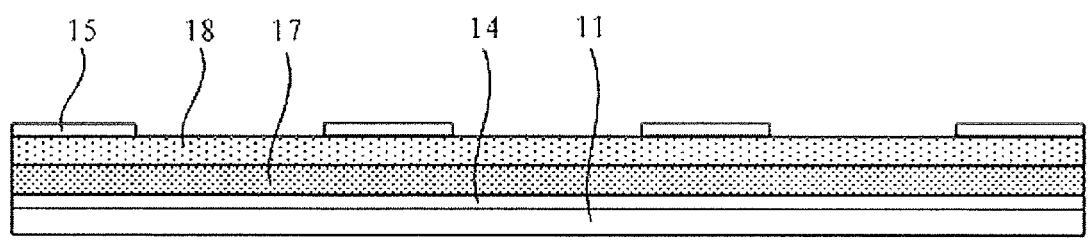
FIG. 2 is a sectional view taken along the A-A direction in FIG. 1.

In this embodiment, the first apertures 20 are in a strip shape, and the second apertures 19 are also in a strip shape. In practical applications, the first apertures 20 and the second apertures 19 may also be of any other shape, which is no more listed here. For clearly illustrating the shape of the first aperture 20, one first aperture 20 in the first electrode layer 14 located above the base substrate 11 is represented in a form of dashed box in FIG. 1. The first electrode portions 141 and the second electrode portions 151 may also in a strip shape. The first aperture 20 and the second aperture 19 may be provided parallel to each other.

In this embodiment, the array substrate may further comprise: an insulating layer formed between the first electrode layer 14 and the second electrode layer 15. Specifically, the insulating layer may comprise a gate insulating layer 17 and a passivation layer 18. For example, the gate insulating layer 17 may be formed by a silicon oxide layer, and the passivation layer 18 may be formed by a silicon nitride layer. The first electrode layer 14 is located on the base substrate 11, the gate insulating layer 17 is located on the first electrode layer 14, the passivation layer 18 is located on the gate insulating layer 17, and the second electrode layer 15 is located on the passivation layer 18. That is to say, the first electrode layer 14, the insulating layer (comprising the gate insulating layer 17 and the passivation layer 18) and the second electrode layer 15 are laminated on the base substrate 11 in this order.

Alternatively, the insulating layer formed on the first electrode 14 may only comprise the gate insulating layer 17 or the passivation layer 18, that is, the insulating layer located in the pixel region may comprise the gate insulating layer 17 or the passivation layer 18. If the passivation layer 18 located on the gate insulation layer 17 in the pixel region is removed before the formation of the second electrode layer 15, and thereafter the second electrode 15 is formed on the gate insulation layer 17, then the insulating layer only comprises the gate insulation layer 17; if the gate insulating layer 17 in the pixel region is removed before the formation of the passivation layer 18, and thereafter the passivation layer 18 is formed in the pixel region and the second electrode 15 is formed on the passivation layer 18, then the insulating layer only comprises the passivation layer 18.

In this embodiment, the second electrode 15 is connected with a drain electrode 161 of the thin film transistor 16 through a via hole 21 located above the thin film transistor 16. Specifically, the second electrode 15 is filled in the via hole 21, thereby achieving its connection with the drain electrode 161 of the thin film transistor 16. In this case, the first electrode 14 is a common electrode, and the second electrode 15 is a pixel electrode.

The array substrate provided by this embodiment comprises: a base substrate; a gate line and a data line located on the base substrate; a first electrode layer and a second electrode layer formed in a pixel region defined by the gate line and the data line, wherein the second electrode layer and the first electrode layer form a multi-dimensional electric field, and wherein both the first electrode layer and the second electrode layer have apertures therein. In this embodiment, by providing apertures in the first electrode layer, the overlapping area between the second electrode layer and the first electrode layer is reduced, and the storage capacitance of the AD-SDS type array substrate is decreased, thus the charging and discharging time of the liquid crystal display panel is reduced. Because the technical solution of this embodiment can reduce the charging and discharging time of the liquid crystal display panel, this embodiment can appropriately reduce the size of the thin film transistors to improve the aperture ratio of the liquid crystal display panel.

Figure 5:
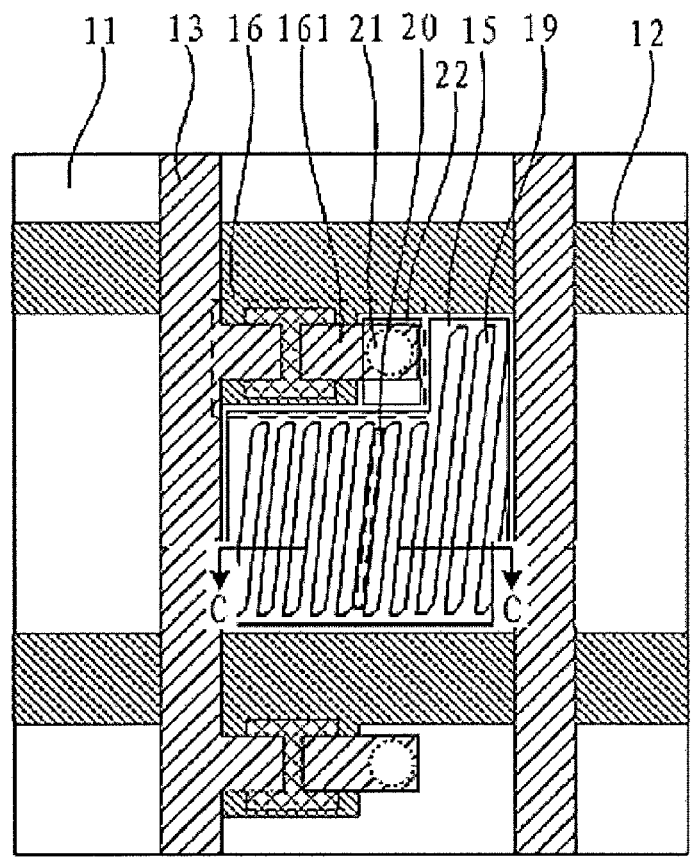
FIG. 5 is a schematic structural view of an array substrate provided by a second embodiment of the disclosed technology.
Figure 6:
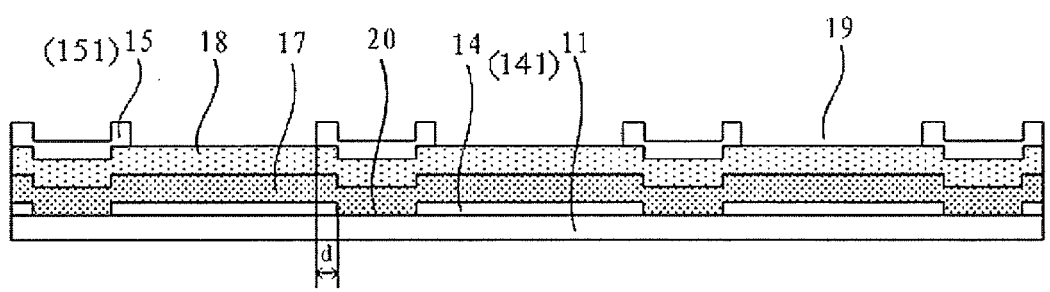
FIG. 6 is a sectional view taken along the C-C direction in FIG. 5.

FIG. 5 is a schematic structural view of an AD-SDS type array substrate provided by a second embodiment of the disclosed technology, and FIG. 6 is a sectional view taken along the C-C direction in FIG. 5. As shown in FIG. 5 and FIG. 6, the array substrate in this embodiment is different from that in the first embodiment described above in that: the first electrode layer 14 in this embodiment is connected with the drain electrode 161 of the thin film transistor 16 through a via hole 21 which is located above the first electrode layer 14. In this embodiment, the first electrode layer 14 may be connected with the drain electrode 161 of the thin film transistor 16 through a connection electrode 22. Specifically, the connection electrode 22 is filled in the via hole 21, thereby achieving the connection between the first electrode layer 14 and the drain electrode 161 of the thin film transistor 16. In this case, the first electrode layer 14 is a pixel electrode, and the second electrode layer 15 is a common electrode.

A third embodiment of the disclosed technology further provides a liquid crystal display panel, the liquid crystal display panel comprises: a color filter substrate and an array substrate provided facing each other and bonded together, and a liquid crystal layer filled between the color filter substrate and the array substrate. Wherein, the array substrate may adopt any array substrate in accordance with the first embodiment or the second embodiment described above, which will not be specifically described here.

The liquid crystal display panel provided by this embodiment comprises: a color filter substrate and an array substrate provided facing each other and bonded together, and a liquid crystal layer filled between the color filter substrate and the array substrate. The array substrate comprises: a base substrate; a gate line and a data line formed on the base substrate; a first electrode layer and a second electrode layer formed in a pixel region defined by the gate line and the data line, wherein the second electrode layer and the first electrode layer form a multi-dimensional electric field. Both the first electrode layer and the second electrode layer have apertures therein. In this embodiment, by providing apertures in the first electrode layer, the overlapping area between the second electrode layer and the first electrode layer is reduced, and the storage capacitance of the AD-SDS type array substrate is decreased, thus the charging and discharging time of the liquid crystal display panel is reduced. Because the technical solution of this embodiment can reduce the charging and discharging time of the liquid crystal display panel, this embodiment can appropriately reduce the size of the thin film transistors to improve the aperture ratio of the liquid crystal display panel.

It can be understood that, the above implementations are merely exemplary implementations for explaining the principle of the disclosed technology; however, the disclosed technology is not limited thereto. For those ordinary skilled in the art, modifications and improvements can be made without departing from the spirit and essence of the disclosed technology, these modifications and improvements should be regarded as within the scope of protection of the disclosed technology.

What is claimed is:

1. An array substrate, comprising:
   a base substrate;
   a gate line and a data line formed on the base substrate, the gate line and the data line defining a plurality of pixel regions;
   a first electrode layer and a second electrode layer formed in each pixel region; and
   an insulating layer provided between the first electrode layer and the second electrode layer,
   wherein the first electrode layer, the insulating layer and the second electrode layer are laminated on the base substrate in this order,
   wherein the first electrode layer is provided with a plurality of first apertures therein, and the first electrode layer comprises a plurality of first electrode portions located between the plurality of first apertures,
   wherein the second electrode layer is provided with a plurality of second apertures therein, and the second electrode layer comprises a plurality of second electrode portions located between the plurality of second apertures,
   wherein, in a plane view, each first electrode portion is partially overlapped with adjacent second electrode portions, and
   wherein an overlapping width between the first electrode portions and the second electrode portions is in a range of 0.2 microns to 2.0 microns,
   wherein the insulating layer has recess portions each of which is opposed to one of the first apertures of the first electrode layer, and each of the second electrode portions is formed on a corresponding recess portion and periphery thereof conformably.

2. The array substrate according to claim 1, wherein each first aperture is provided corresponding to one second electrode portion, and each second aperture is provided corresponding to one first electrode portion.

3. The array substrate according to claim 2, wherein the width of the first apertures is less than the width of the second electrode portions, and the width of the second apertures is less than the width of the first electrode portions.

4. The array substrate according to claim 1, wherein the first apertures each are located under the second electrode portions.

5. The array substrate according to claim 1, wherein the first apertures and the second apertures are in a strip shape, and the first electrode portions and the second electrode portions are in a strip shape.

6. The array substrate according to claim 5, wherein the first apertures and the second apertures are provided parallel to each other.

7. The array substrate according to claim 1, wherein the insulating layer comprises a gate insulating layer and/or a passivation layer.

8. The array substrate according to claim 1, wherein,
   the first electrode layer is a common electrode, and the second electrode layer is a pixel electrode; or
   the first electrode layer is a pixel electrode, and the second electrode layer is a common electrode.

9. The array substrate according to claim 1, wherein the first electrode layer and the second electrode layer are formed of a transparent conductive material.

10. A liquid crystal display panel, comprising: a color filter substrate and an array substrate facing each other and bonded together, and a liquid crystal layer filled between the color filter substrate and the array substrate,
    wherein the array substrate comprises: a base substrate; a gate line and a data line formed on the base substrate, the gate line and the data line defining a plurality of pixel regions; a first electrode layer and a second electrode layer formed in each pixel region; and an insulating layer provided between the first electrode layer and the second electrode layer,
    wherein the first electrode layer, the insulating layer and the second electrode layer are laminated on the base substrate in this order,
    wherein the first electrode layer is provided with a plurality of first apertures therein, and the first electrode layer comprises a plurality of first electrode portions located between the plurality of first apertures,
    wherein the second electrode layer is provided with a plurality of second apertures, and the second electrode layer comprises a plurality of second electrode portions located between the plurality of second apertures,
    wherein, in a plane view, each first electrode portion is partially overlapped with adjacent second electrode portions, and
    wherein an overlapping width between the first electrode portions and the second electrode portions is in a range of 0.2 microns to 2.0 microns,
    wherein the insulating layer has recess portions each of which is opposed to one of the first apertures of the first electrode layer, and each of the second electrode portions is formed on a corresponding recess portion and periphery thereof conformably.

11. The liquid crystal display panel according to claim 10, wherein each first aperture is provided corresponding to one second electrode portions, and each second aperture is provided corresponding to one first electrode portions.

12. The liquid crystal display panel according to claim 11, wherein the width of the first apertures is less than the width of the second electrode portions, and the width of the second apertures is less than the width of the first electrode portions.

* * * * *